United States Patent
Sundstrom

(10) Patent No.: US 9,111,915 B1
(45) Date of Patent: Aug. 18, 2015

(54) THERMAL CONDUCTION COOLING

(71) Applicant: Honeywell International Inc., Morristown, NJ (US)

(72) Inventor: Lance LeRoy Sundstrom, Pinellas Park, FL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 14/188,555

(22) Filed: Feb. 24, 2014

(51) Int. Cl.
*H01L 21/44* (2006.01)
*H01L 23/053* (2006.01)
*H01L 23/485* (2006.01)

(52) U.S. Cl.
CPC .................................. *H01L 23/485* (2013.01)

(58) Field of Classification Search
CPC .............................................. H01L 21/76877
USPC ................... 257/700, 736, 750; 438/652, 625
See application file for complete search history.

(56) References Cited

U.S. PATENT DOCUMENTS

| | | | |
|---|---|---|---|
| 4,941,067 A | 7/1990 | Craft | |
| 6,882,536 B2 | 4/2005 | Deeney et al. | |
| 7,230,317 B2 | 6/2007 | Pearson et al. | |
| 7,309,912 B1 | 12/2007 | Shi et al. | |
| 7,787,249 B2 | 8/2010 | Sundstrom | |
| 8,331,105 B2 | 12/2012 | Chikamichi | |
| 2013/0010432 A1 | 1/2013 | Sundstrom et al. | |

FOREIGN PATENT DOCUMENTS

| | | |
|---|---|---|
| EP | 0391057 A2 | 10/1990 |
| JP | 4967241 B2 | 7/2012 |

OTHER PUBLICATIONS

Kamo et al., "An Optimization Method for Placement of Decoupling Capacitors on Printed Circuit Board," IEEE Conference on Electrical Performance of Electronic Packaging, Oct. 23-25, 2000, pp. 73-76.
Sundstrom, L.L., "PBA Thermal Conduction Structures, Components & Methods," published at http://ip.com/IPCOM/000228041 on Jun. 4, 2013, 8 pp.

*Primary Examiner* — Calvin Lee
(74) *Attorney, Agent, or Firm* — Shumaker & Sieffert, P.A.

(57) ABSTRACT

An assembly including a substrate that includes a plurality of conductive plane layers including a first group and a second group of common conductive plane layers, where electrically isolated first and second attach pads are on an edge surface of the substrate and at least thermally coupled to the first and second groups of common conductive plane layers, respectively. A surface mount technology (SMT) component, such as a thermal jumper, mounted on the first and second attach pads such that the SMT component is at least thermally coupled to the first and second groups of common conductive plane layers via the first and second attach pads, respectively. Methods of forming such an assembly also are disclosed.

20 Claims, 5 Drawing Sheets

THERMAL CONDUCTION COOLING

TECHNICAL FIELD

The disclosure relates to substrate structures, surface mount technology (SNIT) components, and fabrication and assembly methods associated with effecting thermal conduction cooling of electronic assemblies.

BACKGROUND

One or more components, such as a discrete electrical or non-electrical device and/or an integrated circuit (IC) can be mounted and connected to a substrate. The substrate in turn can provide mechanical support for the component(s), allowing the component(s) to be physically incorporated into an assembly. The substrate also can provide electrical and/or thermal connectivity, allowing component(s) to be electrically and/or thermally integrated into the assembly. Many of the components of such an assembly (e.g., an electronic assembly) dissipate heat during normal operation. When convection cooling is unavailable or insufficient, an assembly can rely on conduction cooling to keep component temperatures within safe operating limits. The mounting interface of an assembly may serve as a heat sink for conduction cooling. Components can have one or more direct electrical connections to one or more circuit power and/or ground layers of a supporting substrate.

Thermal conduction cooling techniques include the addition of one or more dedicated heat sink layers in a substrate positioned adjacent to circuit power and/or ground layers. Such a technique may rely on broadside thermal conduction across one or more dielectric layers between circuit power and/or ground layers and the dedicated heat sink layers or layer areas. The dedicated heat sink layers or layer areas can be connected directly to a mounting interface of the assembly, typically a chassis ground.

SUMMARY

In some examples, the present disclosure discloses components, printed boards (PBs), printed board assemblies (PBAs), and packages including one or more components. In some examples, the component may be an edge-mounted component at least thermally coupled to first and second groups of common conductive plane layers via attach pads on an edge surface of a substrate, such as, a separate or integral part of a package or a PB, rather than on its top or bottom surfaces. In some examples, the edge-mounted component comprises a thermal jumper that is thermally conductive but substantially electrically non-conductive. The first and second attach pads are substantially electrically isolated from each other to maintain electrical isolation between the first and second groups of common conductive plane layers. Thermal energy may be conducted between the first and second groups of common conductive plane layers via, the edge-mounted component and via, the connected first and second attach pads, respectively, while maintaining AC and DC electrical isolation.

In one example, the disclosure relates to an assembly with a substrate comprising a plurality of conductive plane layers, wherein the plurality of conductive plane layers comprises a first group of common conductive plane layers and a second group of common conductive plane layers, and wherein at least, the plurality of conductive plane layers at least partially defines an edge surface of the substrate disposed between a top surface and a bottom surface of the substrate. Such an assembly further includes a first attach pad on the edge surface of the substrate, wherein the first attach pad is at least thermally coupled to the first group of common conductive plane layers, a second attach pad on the edge surface of the substrate, wherein the second attach pad is at least thermally coupled to the second group of common conductive plane layers, wherein the first attach pad is substantially electrically isolated from the second attach pad, and the first group of common conductive plane layers is substantially electrically isolated from the second group of common conductive plane layers, and a discrete surface mount technology (SMT) component mounted on the first attach pad and the second attach pad such that the SMT component is at least thermally coupled to the first group of common conductive plane layers via the first attach pad and to the second group of common conductive plane layers via the second attach pad.

In another example, the disclosure relates to a method for forming an assembly, the method including placing a discrete SMT component adjacent to a first attach pad and to a second attach pad, and mounting the discrete SMT component to the first and second attach pads to form the assembly. In such an example, the assembly includes a substrate including a plurality of conductive plane layers, where the plurality of conductive plane layers comprises a first group of common conductive plane layers and a second group of common conductive player layers, wherein the plurality of conductive plane layers at least partially defines an edge surface of the substrate disposed between a top surface and a bottom surface of the substrate. The assembly further includes the first attach pad on the edge surface of the substrate, where the first attach pad is thermally coupled to the first group of common conductive plane layers, and the second attach pad on the edge surface of the substrate, wherein the second attach pad is thermally coupled to the second group of common conductive plane layers, the first attach pad is substantially electrically isolated from the second attach pad, and the first group of common conductive plane layers is substantially electrically isolated from the second group of common conductive plane layers. In such an example, the discrete SMT component is mounted on the first attach pad and the second attach pad such that the SMT component is thermally coupled to the first group of common conductive plane layers via the first attach pad and to the second group of common conductive plane layers via the second attach pad.

In another example, prior to placing the discrete SMT component adjacent to the first and second attach pads as described in a preceding example, the disclosure provides a method of dispensing a bonding material in to at least a portion of a recess that separates the first attach pad from the second attach pad, wherein the bonding material bonds to at least the edge surface of the substrate, and dispensing a solder material on to the first and second attach pads. This such an example, after dispensing the bonding and solder materials, the discrete SMT component is placed in contact with the bonding material and the solder material, so that a first terminal of the discrete SMT component is placed in contact with the solder material dispensed on to the first attach pad and a second terminal of the discrete SMT component is placed in contact with the solder material dispensed on to the second attach pad. Further, after placing the discrete SMT component as stated, the disclosure further describes curing the bonding material, drying the solder material, and reflow soldering the solder material.

In another example, additional steps of an example technique of forming an assembly according to this disclosure include, prior to dispensing bonding material and solder material referenced above, removing a first portion of the substrate to form a slot in the substrate, wherein the substrate is coextensively connected to a panel and at least each plane layer of the first and second groups of common conductive plane layers at least partly extends in to the first portion of the substrate that is removed, and wherein the slot extends through at least a portion of at least the plurality of conductive plane layers of the substrate, and seeding and plating at least a slot edge surface of the substrate exposed by formation of the slot to form a plated slot edge surface. The example technique also includes, wherein at least one of the top surface or the bottom surface of the substrate comprises a metal, patterning the metal of the at least one of the top surface or bottom surface so that the metal surrounds the plated slot edge surface defining the slot, removing a second portion of the substrate to isolate a portion of the plated slot edge surface, and forming the recess in the isolated portion of the plated slot edge surface to form the first and second attach pads on the edge surface, wherein a portion of the isolated plated edge surface adjacent to one side of the recess comprises the first attach pad, a portion of the plated edge surface adjacent to a side of the recess opposite of the one side comprises the second attach pad, and the recess separates and substantially electrically isolates the first attach pad from the second attach pad.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
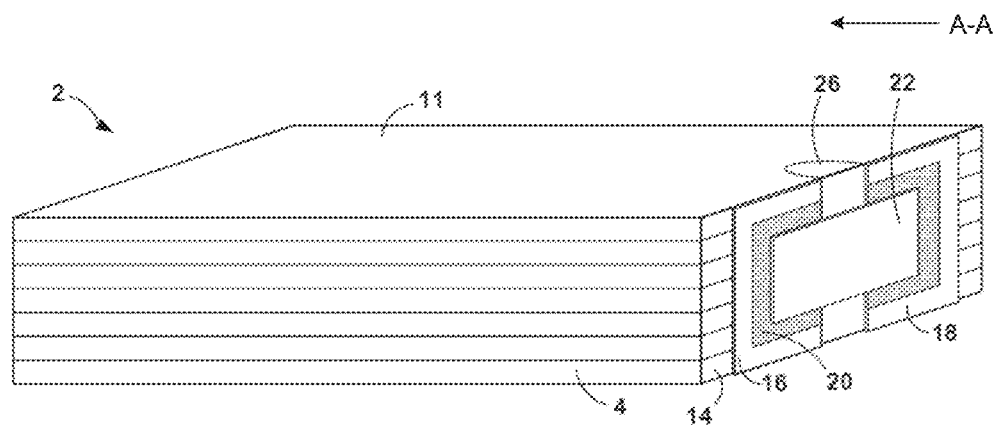
FIG. 1 is a conceptual diagram illustrating a perspective view of an example assembly according to this disclosure.

As described above, the present disclosure relates to printed boards (PBs), printed board assemblies (PBAs), and packages including one or more electrical or non-electrical components. In operation, multiple components may be mounted to and electrically, thermally and/or mechanically connected to a substrate (e.g., a PB or package) to create an assembly with a network of interconnected components. The substrate may include a separate or integral part of an integrated circuit (IC), multichip module (MCM), or hybrid package, such as a separate bismaleimide triazine (BT) laminate, multilayer ceramic substrate or an integral substrate of a multilayer ceramic package, or a printed board (PB), and the assembly may include a packaged IC, MCM, hybrid or printed board assembly (PBA). Substrate-interconnected components and assembly mounting interface can provide one or more paths for electrical and/or thermal current to flow, which in turn define one or more electrical and/or thermal circuits or pathways.

During operation, electrons may flow through an electrical component mounted on the substrate, which may generate heat as electrical energy is converted into thermal energy. Such an electrical component may include, for example, a resistor, capacitor, inductor, diode, transistor, or an IC. A non-electrical component, as referenced, may include, for example, a thermal jumper, heat sink, or stiffener. This generated heat may raise the temperature of the substrate and components. If, for example, the thermal impedance or resistance between the components and the electronic assembly mounting interface is not sufficiently low, the temperature of the components can exceed a desired or safe operating temperature.

Enhanced thermal conduction between electrical and non-electrical components and the electronic assembly mounting interface therefore may be desirable to remove a sufficient amount of heat to keep components within the desired or safe operating temperature ranges. Effectively conducting thermal energy generated by the one or more components (e.g., by conducting it away from the electrical or non-electrical component) may improve the performance of an electronic assembly by, for example, lowering the thermal impedance or resistance between the one or more components and the electronic assembly mounting interface and by increasing the reliability of the one or more components relative to an assembly in which heat is not effectively removed or dissipated.

An electrical or non-electrical component may include several different surfaces that may provide electrical and/or thermal conduction pathways for conducting electrical or thermal current to or from the component. With substrate mounted active components, for example, a component may define a bottom surface adjacent to a substrate surface. In some examples, thermal energy may be removed through the bottom surface, attach pads, terminals and/or soldering connections of the component and transferred into a one or more thermally conductive plane layers of the substrate. The thermal energy transferred to the thermally conductive plane layers may then be further transferred to, for example, one or more thermal jumpers (also referred to as thermal shunts, heat jumpers, or heat shunts) for further dissipation of the thermal energy. By effectively cooling or reducing the operating temperature of components of a substrate may, for example, increase the density with which components can be attached to a substrate and/or improve the performance and reliability of a component by reducing its operating temperature.

Further, while package and PB dielectric layers may serve as sufficient electrical insulators, they often are poor thermal conductors. As such, large broadside coupling areas between circuit power and/or ground layers and heat sink layers may be required to enable sufficient thermal conduction across these dielectric layers (see, for example, Table 1 and the thermal resistance formula below). Electromagnetic compatibility and interference (EMC/EMI) requirements often require circuit power and ground nets to be at least direct coupled (DC) electrically isolated from chassis. Large broadside area coupling for thermal conduction can also result in undesirable alternating current (AC) coupling that can cause failure of EMC/EMI requirements. Certain techniques for increasing power and/or ground to chassis ground broadside thermal coupling without additional substrate conductor layers are described at U.S. Pat. No. 7,787,249 B2 the entire contents of which is incorporated herein by reference.

While good electrical conductors often may be good thermal conductors, the reverse is not necessarily true in every case. For example, Table 1 lists the thermal conductivity of certain electrically insulating materials used for electronic substrate dielectric layers and for thermal jumpers. The thermal conductivity of ceramics tends to vary with grain size and purity, and the thermal conductivity of CVD diamond tends to vary inversely with deposition rate. Some electrically insulating materials have a thermal conductivity approaching or exceeding that of pure copper (Cu) at 398 W/m-K at 20° C., which is often used for BT & PB laminate substrate conductor layers.

TABLE 1

| Material | Thermal Conductivity (W/m-K at 20° C.) |
| --- | --- |
| Bismaleimide triazine (BT) laminate | 0.2 (plane-plane) |
| Polyimide laminate | 0.3-0.4 (plane-plane) |
| Aluminum oxide or alumina ($Al_2O_3$) | 18-36 (grain size dependent) |
| Aluminum nitride (AlN) | 80-260 (grain size dependent) |
| Beryllium oxide or beryllia (BeO) | 184-300 (grain size dependent) |
| Chemical vapor deposition (CVD) diamond | 500-2000 (deposition rate dependent) |

As referenced above, the formula for calculating the thermal resistance of a material, as discussed herein, is $R_\theta = L/(A*k)$, expressed in units of degrees Kelvin per watt (° K/W), which is equivalent to degrees Celsius per watt (° C./W), where "L" is the material path length, "A" is the material path cross-section area, and "k" is the material bulk thermal conductivity (expressed in, for example, watts per meter-Kelvin (W/m° K)). For example, thermal resistance between 3 inch×3 inch circuit ground (GND) and chassis ground (CGND) planes separated by 0.005 inches of high performance polyimide laminate with a thermal conductivity of 0.4 W/m° K, where 1 m=39.37 inches, is given by: 0.005 inches/(3 inches*3 inches*(0.4/39.37 inches*° C.))=0.0547° C./W.

In one example, when SMT components are not edge-mounted as described in this application, a thermal jumper may be mounted on a thermally conductive plane layer that defines the top (primary) or bottom (secondary) layer of a substrate. Thermal energy may be conducted from a component mounted on the top or bottom layer or surface to the thermal jumper via, the thermally conductive top or bottom layer of the substrate. From the thermal juniper, thermal energy may be conducted, for example, to a chassis mounting interface of the electronic assembly to reduce the operating temperature of the component. However, in some instances, such a thermal pathway may have relatively high thermal resistance due to the single conductive layer path between the component and the thermal jumper and between the thermal jumper and the electronic assembly mounting interface. Thus, the amount of thermal energy transferred from the component through the thermal jumper to the electronic assembly mounting interface may be insufficient to maintain the operating temperature of the component at a desirable level.

In accordance with the present disclosure, assemblies including one or more substrate structures and assembly features for enhancing thermal management and conduction between components and the electronic assembly mounting interface are described. The present disclosure describes features of SMT components mounted on attach pads formed at one or more edge surfaces of a substrate, such as a PB or package, via edge milling and/or plating of the surface. Conductive plane layers of the substrate may be thermally coupled (and, in some cases, electrically coupled) to and extend directly in to the attach pads formed at one or more edge surfaces. Such attach pads may extend along substantially the entire height of the edge surface of the substrate, or a portion thereof, to provide thermal conduction pathways from, for example, components through conductive plane layers and attach pads through edge-mounted SMT components to the electronic assembly mounting interface. For case of description, the edge-mounted SMT component is primarily described herein as a thermal juniper. However, examples are not limited as such and the SMT component may be any suitable component that may allow examples of the disclosure to function as described herein.

A substrate with thermal jumpers edge-mounted on attach pads, as described by this disclosure, may present thermal conduction pathways with reduced thermal resistance and impedance, among other desirable features, allowing for enhanced performance of components and/or electronic assemblies. For example, compared to examples in which a thermal jumper is mounted and thermally coupled to only a single conductive layer on a top or bottom surface of a substrate to form a thermally conductive path for transferring component heat out of a substrate, such as a PB, the use of an edge-mounted thermal jumper that is thermally coupled to two or more thermally conductive plane layers of a substrate at a substrate edge surface may allow for a conduction pathway with substantially reduced thermal resistance and increased heat transfer, e.g., due to the increase in the number of conductor layers in direct thermal contact with the thermal juniper.

In some examples, groups of selected conductive plane layers (i.e., more than one plane layer) of substrates may be designated to serve one or more functions during operation of an electronic assembly, for example, conduction of power, conduction of ground, dissipation of heat or thermal energy, grounding, and/or conduction or grounding to a mounting interface of the electronic assembly. A group of conductive plane layers serving a common function during operation of the electronic assembly may be designated as common conductive plane layers, while those serving different functions may be referred to as non-common conductive plane layers. In this way, one or more attach pads of the disclosed assembly may be connected to one or more particular groups of common conductive plane layers serving common functions within the PBA or package. Such attach pads may be substantially electrically isolated from one another, providing electrical isolation among groups of common plane layers, while still providing thermal conduction through connected edge-mounted thermal jumpers.

Moreover, a conductive plane layer may be segregated in to more than one functional areas, so that, for example, a first area of a conductive plane layer is connected to and part of a first group of common conductive plane layers, and a second area of the same conductive plane layer is connected to and part of a second group of common conductive plane layers. In such a case, the multiple areas of one conductive plane layer would be substantially electrically isolated from one another.

As discussed more fully below, the attach pads may be on one or more edge surfaces of the substrate by virtue of their having been, for example, screen printed or plated and patterned on the edge surface of the substrate. In some examples, the attach pads may be on a periphery of the edge surface of a substrate, or on an edge surface that is disposed internally within the substrate and not on a periphery of the substrate. In the latter instance, one or more internally disposed edge surfaces may define a cavity within the substrate, in to which an SMT component such as a thermal jumper could be inserted for mounting.

Edge attach pads can be formed on a multilayer ceramic substrate by, for example, sawing the co-fired substrate to size, then selectively screen printing and firing conductive paste for the attach pads directly onto one or more edges. Edge attach pads also can be formed on a multilayer organic laminate substrate, such as a BT or PB substrate, by milling one or more slots in the sub or final laminate, plating the milled edges of the slots, then milling away some of the edge plating to form separate attach pads on an edge surface. The top and bottom major surfaces of an organic laminate substrate can be photo-etch patterned up to a minimum annular ring around milled edges. The milled edges themselves can be plated but not photo patterned. Portions of plated edges can then be separated from each other by subsequent milling steps to separate the continuous plated edge into separate edge plate regions (e.g., attach pads). Milled slots or recesses and edge plate regions can be formed anywhere on the substrate, not just at its periphery, for example internally disposed within the substrate.

A plated edge surface (or attach pads formed therefrom) of a substrate may provide a thermal pathway that allows thermal conduction from, e.g., the components of the electronic assembly through thermally conductive plane layers, through plated edge surface attach pads, solder material, terminals of an SMT component, such as a thermal jumper, and to a mounting interface. Such a thermal pathway may assist in cooling or reducing the temperature of components of an electronic assembly during operation.

In some examples, plane layers of the substrate of an example assembly according to this disclosure may define a recess in the edge surface of the substrate, wherein at least a portion of the recess separates and substantially electrically isolates a first attach pad on the edge surface from a second attach pad on the edge surface. The example assembly can further include a bonding material that at least partially fills at least a portion of the recess (for example, a milled recess) separating the first attach pad from the second attach pad, where the bonding material may bond to the edge surface (e.g., that portion of the edge surface that defines the recess) as well as to the SMT component to be mounted on the first and second attach pads. A bonding material such as epoxy may be dispensed in the recess, and solder paste dispensed on to the first and second attach pads, prior to placement of the SMT component adjacent to the first and second attach pads. The epoxy also may be cured to maintain SMT component placement during solder paste reflow, for example during vapor phase solder paste reflow.

As noted, a substrate of an example electronic assembly of this disclosure may be, for example, a PB or an integral or separate part of an electronic package. Thermal jumpers mounted on attach pads (e.g., plated edge surfaces) of such a substrate with direct connections to substrate conductive plane layers connected to primary or secondary-side mounted SMT components may replace (or be provided in addition to) conventional trace, punched, mechanical, or laser-drilled via thermal conduction pathways. For components in, for example, a multi-layer ceramic or bismaleimide triazine ("BT") substrate electronic package, such as a land grid array ("LGA"), ball grid array ("BGA") or column grid array ("CGA"), edge-mounted SMT thermal jumpers may provide low thermal resistance between connected common substrate conductive plane layers while maintaining electrical isolation between them. Extending common conductive plane layers directly in to attach pads for edge-mounted SMT components may eliminate the need for trace and via connections, or for via clearance holes in non-common plane layers, which can reduce plane layer electrical and thermal impedance and liberate space on multiple substrate layers for signal routing. Each edge-mount attach pad may connect multiple common plane layers to each other along a wide surface area of low electrical and thermal impedance. An edge-mounted. SMT component likewise can have low thermal impedance connection to multiple common plane layers, and its attachment may further reduce the electrical and thermal impedance of connections between these common plane layers.

In some examples, a recess may be formed in a portion of the edge surface of the substrate defined by the plurality of plane layers of the substrate (e.g., dielectric layers and conductive plane layers). A routing or milling process may create the recess and expose the plane layers along with edge surface. First and second attach pads can be on (e.g., plated on) the recessed edge surface, so that an SMT component can be mounted on and thermally coupled to the first and second attach pads. In this example, the SMT component may be disposed substantially entirely within the recess formed on, for example, an edge surface at the periphery of the substrate, such that the mounted SMT component is recessed from the peripheral edge surface.

An example assembly of this disclosure may further include a solder material that connects an SMT component to the attach pads discussed herein. In an example assembly where an SMT component is mounted on attach pads on a recessed edge surface as discussed above, the solder material may be in contact not only with the bottom portions of terminal surfaces of the SNIT component (e.g., a thermal jumper) or a bottom surface of the surface mount component, but also with side and end edge terminal surfaces of the SMT component to form solder fillets, providing increased surface area of contact and lower thermal and/or electrical resistance or impedance in conducting thermal and/or electrical energy.

The present disclosure also describes example techniques of forming an electronic assembly, including placing an SMT component (such as a thermal jumper) adjacent to first and second attach pads and mounting the SMT component to the attach pads. In such an example technique, the example assembly may have features including first and second attach pads that are on an edge surface of a substrate. Edge surfaces described herein optionally may be configured to (or, for example, milled or routed to) span fewer than all of the plurality of plane layers, or be disposed internally within the periphery of the substrate and not on the periphery of the substrate. In the latter case, one or more internally disposed edge surfaces may at least partially define a cavity within the substrate, in which, for example, an SMT component may be placed and mounted as described in this disclosure. The first and second attach pads may be substantially electrically isolated from each other. Further, the substrate of such an example electronic assembly of the example method can include a plurality of plane layers, e.g., dielectric plane layers and thermally and electrically conductive plane layers, wherein groups of the conductive plane layers may have common and varying functions associated with operation of an electronic assembly.

In some examples, techniques of forming an assembly as described in this disclosure can include forming and plating of an edge surface of a substrate to form a plated edge surface of the substrate, followed by routing or milling of the plated edge surface to form a recess in the plated edge surface and thereby form separate first and second attach pads on the edge surface of the substrate. Other portions of the substrate, or of a larger panel of which the substrate is apart, may optionally be routed or milled before, after, or as part of the process used to form the edges to be plated. An example technique may further include filling at least a portion of the recess that separates the first attach pad from the second attach pad with a bonding material (e.g., an epoxy material) that bonds to the edge surface or recessed edge surface of the substrate and to the SMT component, enabling at least a mechanical bond between the substrate and the SMT component.

In some examples, placing of the SMT component adjacent to first and second attach pads as described herein may optionally include placement of the SMT component in contact with the bonding material in the recess, wherein the bonding material bonds or otherwise attaches the SMT component to the substrate. The example technique can also include mounting the SMT component by reflow soldering first and second terminals of the SMT component to first and second attach pads of the SMT component, respectively, e.g., using any suitable soldering techniques. Further, a second SMT component may, in some examples, be placed adjacent to and mounted to third and fourth attach pads in the same manner as the first SMT component to the first and second attach pads. Likewise, additional attach pads may be formed on one or more edge surfaces of the substrate of an example assembly of this disclosure. Alternatively, the edge-mounted attach pads can wrap around onto the substrate top (primary) and/or bottom (secondary) surfaces for mounting additional SMT components (e.g. thermal jumpers or decoupling capacitors) in parallel with edge-mounted SMT components.

The present disclosure may have pertinence to, for example, military, space or other applications. In some applications in those industries, limited (or a lack of) forced air for thermal convection cooling may present an enhanced need for reliance on thermal conduction cooling for thermal management of electronic assemblies. As noted above, the trend of increasing component and electronic assembly power densities, operating frequencies, and edge rates may continue to challenge requirements of effective management of conduction cooling and electromagnetic compatibility/interference (EMC/EMI) in electronic design, while goals of minimization of size, weight, and cost of the electronic assembly are maintained. This disclosure presents configurations of substrate edge attach pads (or plate edge surfaces) and SMT components (such as thermal jumpers) that may provide effective and efficient thermal conduction cooling, while enhancing EMC/EMI performance and reducing electronic assembly size, weight and cost.

FIG. 1 is a conceptual diagram illustrating a perspective view of an example assembly according to this disclosure.

While the example of FIG. 1 presents a portion of an example assembly, it should be understood that the disclosure is not limited to such an assembly and may include, for example, other substrate and assembly configurations. The assembly of FIG. 1 will be described with reference to the conceptual diagrams of FIGS. 2A, 2B, 2C and 3, which show different views of the assembly of FIG. 1. Although a portion of an example assembly is depicted in the referenced FIGS., an assembly according to this disclosure may include numerous different substrate and assembly shapes and configurations.

Figure 2A:
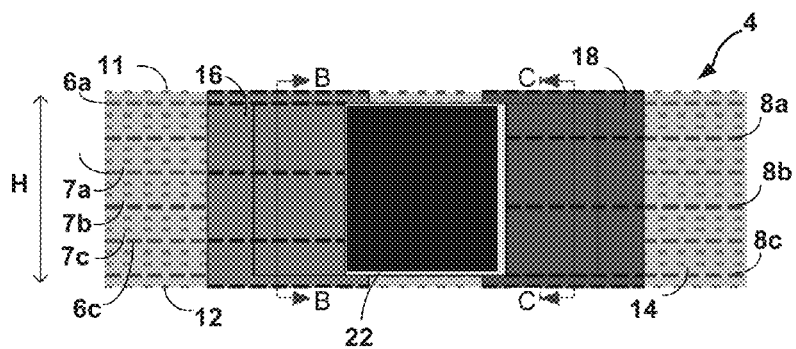
FIG. 2A is a schematic diagram illustrating a side view of the example assembly of FIG. 1 of this disclosure along line A-A.
Figure 2B:
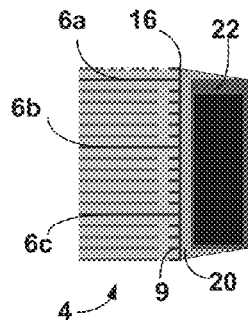
FIG. 2B is a schematic diagram illustrating a cross-sectional view of the example assembly of FIG. 2A along line B-B.
Figure 2C:
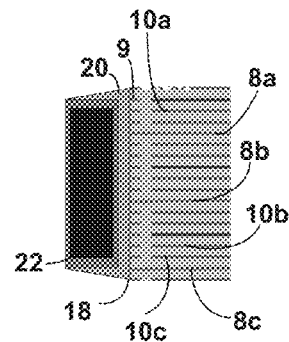
FIG. 2C is a schematic diagram illustrating a cross-sectional view of the example assembly of FIG. 2A along line C-C.

As shown, assembly 2 may include a substrate 4 having a plurality of plane layers, including, for example, a plurality of dielectric or insulating plane layers, such as 7a, 7b and 7c of FIG. 2A (note that not all layers(e.g., dielectric layers) are labeled, for the purpose of simplicity), and a plurality of conductive plane layers, such as, conductive plane layers, 6a, 6b and 6c of FIG. 2B, and conductive plane layers 8a, 8b and 8c of FIG. 2C. As will be described below, conductive plane layers 6a, 6b, 6c, 8a, 8b and 8c may be thermally conductive plane layers formed of any suitable thermally conductive material, such as, e.g., Copper (Cu). In some examples, conductive plane layers 6a, 6b, 6c, 8a, 8b and 8c may also be electrically conductive. As referenced above, the plurality of conductive plane layers (including conductive plane layers 6a, 6b, 6c, 8a, 8b and 8c) may be further designated as groups of common conductive plane layers. Each conductive plane layer of a particular group of common conductive plane layers may serve a common function during operation of the electronic assembly with other conductive plane layers in its group, while conductive plane layers serving different functions may be referred to as non-common conductive plane layers. In this way, as referenced, one or more attach pads of the disclosed assembly may be connected to one or more particular groups of common conductive plane layers serving common functions within the PBA or package. The groups of common conductive plane layers may include, for example, a plurality of conductive power plane layers, a plurality of conductive ground plane layers or a plurality of dedicated conductive heat dissipation plane layers. For simplicity, FIGS. 2A, 2B, and 2C show each conductive plane layer as being a part of a single group of common conductive plane layers, but as noted, a single conductive plane layer can be divided in to multiple areas belonging to different groups of common conductive plane layers. The horizontal, parallel lines within substrate 4 shown at FIG. 1 are representative of internal conductive plane layers, but the conductive plane layers they represent may not necessarily extend to the edge surface on all sides of substrate 4.

In some examples, first group of common conductive plane layers 6a. 6b and 6c (collectively referred to as "first group of common conductive plane layers 6"), as shown in FIG. 2B, may include a plurality of thermally and electrically conductive common circuit power plane layers, a plurality of thermally and electrically common ground plane layers, or other plane layers. In some examples, first group of common conductive plane layers 6 of substrate 4 may be only thermally conductive, or both thermally and electrically conductive. Similarly, second group of common conductive plane layers 8a, 8b and 8c (collectively referred to as "second group of common conductive plane layers 8"), as shown in FIG. 2C, also may include, for example, a plurality of thermally and electrically conductive common circuit power plane layers, a plurality of thermally and electrically common ground plane layers, or thermally and electrically common conductive chassis ground (thermal mounting interface) plane layers. In some examples, second group of plane layers 8 of substrate 4 may be only thermally conductive, or both thermally and electrically conductive. The first group of common conductive plane layers are not the same as the second group of common conductive plane layers, where for example the first group is attached to the first attach pad, which is attached to a first terminal of an SMT component, and the second group is attached to a second attach pad, which is attached to the second terminal of an SMT component.

Substrate 4 may be, without limitation, a printed board (PB) or a separate or integral part of an electronic package. The number of dielectric or insulating plane layers, or of conductive plane layers in the plurality of plane layers designated with reference numerals in FIGS. 1, 2A, 2B, 2C and/or 3 are for the purpose of example only, and should not be viewed as a limitation on the number of individual plane layers of a particular type disposed in substrate 4. As noted, conductive plane layers may be composed of copper (Cu), or any other suitable electrically and/or thermally conductive material, depending on the intended function of the plane layer. For example, for BT or BT laminate substrates, conductive plane layers may be composed of (Cu). For low temperature co-fired ceramic substrates, the conductive plane material may be gold (Au) or copper (Cu). For high temperature co-fired ceramic substrates, the conductive plane material may be tungsten (W).

Substrate 4 may be an electronic package composed of or including any number of materials, such as low or high temperature co-fired ceramic or bismaleimide triazine (BT) laminate, in the form of a land grid array (LGA), ball grid array (BOA), column grid array (CGA), dual flat pack (DFP) or quad flat pack (QFP). Certain PB edge plate connection structures and SMT thermal jumpers for PBA thermal management also are described in a publication entitled, "PBA Thermal Conduction Structures, Components and Methods," IP.com Disclosure No. IPCOM000228041D, dated Jun. 4, 2013, the entirety of which is also incorporated herein by reference.

A plurality of plane layers of substrate 4 (e.g., conductive plane layers separated by dielectric or insulating plane layers) may define an edge surface 14 of substrate 4 between a top surface 11 and a bottom surface 12 of substrate 4. Assembly 2 may also include first attach pad 16 on edge surface 14, where first attach pad 16 is at least thermally coupled to the first group of common conductive plane layers 6. The assembly also includes a second attach pad 18 on edge surface 14, where second attach pad 18 is at least thermally coupled to the second group of common conductive plane layers 8. Second attach pad 18 may be substantially electrically isolated from first attach pad 16 (e.g., electrically isolated or nearly electrically isolated). Second group of conductive plane layers 8 to which second attach pad 18 is at least thermally coupled may be different plane layers than the first group of conductive plane layers 6 to which first attach pad 16 is attached, as shown at FIGS. 2B and 2C.

As mentioned above, first attach pad 16 and second attach pad 18 of assembly 2 as shown at FIG. 1 may be on edge surface 14 of substrate 4 by virtue of their having been plated on edge surface 14. In some examples, as further described in reference to FIGS. 5A-5D, recess 24 may be formed in the continuous plated edge surface to form and separate the plated edge surface in to electrically isolated first attach pad 16 and second attach pad 18. The recess may be formed, e.g., via routing or milling to remove a portion of the continuous plated edge surface. A plated edge surface (or attach pads formed therefrom) of substrate 4 may provide a thermal pathway that allows thermal conduction from between the components and mounting interface of an electronic assembly through first and second groups of common thermally conductive plane layers through first and second attach pads, through solder material 20 and terminals 21, 23 and body of an SMT component 22, such as a thermal jumper. Such a thermal pathway may assist in cooling or reducing the temperature of components of an electronic assembly during operation. SMT component 22 (such as a thermal jumper) as disclosed herein may be, for example, an SMT chip component of various sizes composed of, without limitation, beryllium oxide or beryllia (BeO), aluminum nitride (AlN), or diamond formed by at least one of chemical vapor deposition or chemical vapor infiltration ("CVD/CVI"), with metal terminations.

Plating of edges of a laminate substrate BT or PB) as described by this disclosure may include techniques similar to or the same as conventional laminate substrate through-hole via plating, except that a round, drilled via hole can be replaced with a routed or milled slot (for example slot 46, see FIG. 5B), and a round via pad on each conductive plane layer may be replaced with a slot pad 9 as shown at FIGS. 2B and 2C, to form a minimum annular ring around the slot. Slot pad 9 on each conductive plane layer for example, the isolated segments of conductive plane layers connected to the attach pads shown at FIGS. 2B and 2C or to plated edge surface 48 (described below) may be designed to provide a minimum annular ring around a routed/milled slot for metallurgical anchoring of final remaining edge plating, except at intended recesses. Slot pad 9 may be, for example, a portion of a conductive plane layer composed of copper that has been isolated by dielectric etching. A technique for fabricating a substrate sub-lamination or final lamination with a plated edge surface is discussed in more detail in reference to FIGS. 5A-5D and FIG. 7.

Figure 5A:
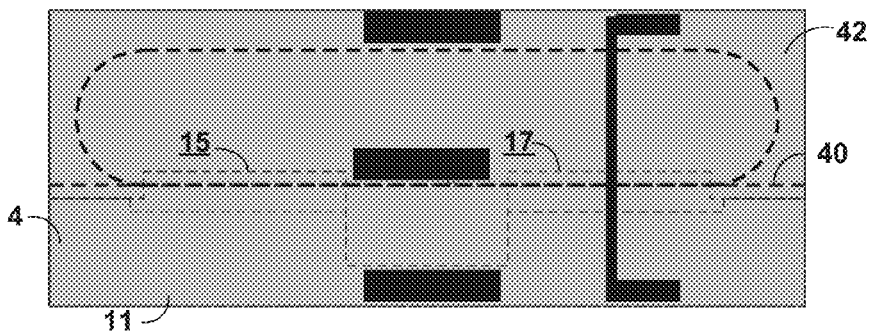
FIG. 5A is a schematic diagram illustrating a top view of a substrate at a stage of an example method of forming the example assembly of FIG. 3.
Figure 5B:
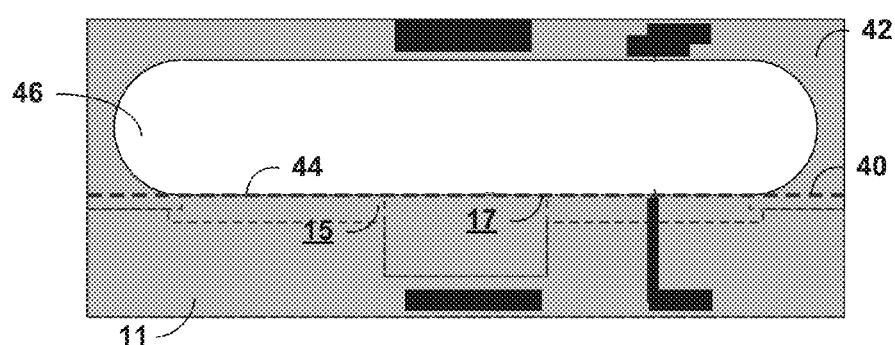
FIG. 5B is a schematic diagram illustrating a top view of a substrate at a stage of an example method of forming the example assembly of FIG. 3, after a routing or milling step.
Figure 5C:
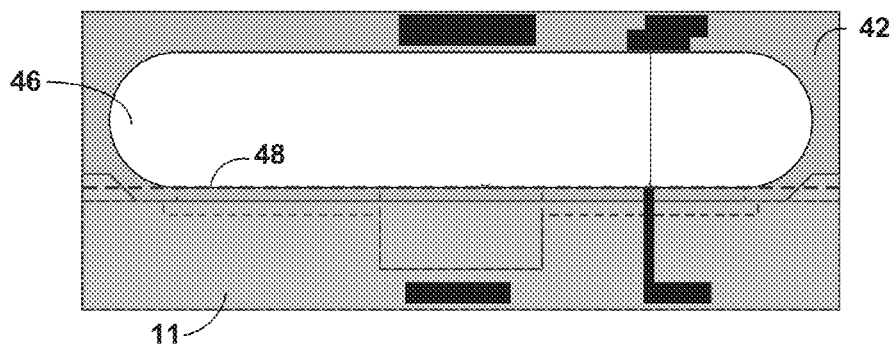
FIG. 5C is a schematic diagram illustrating a top view of a substrate at a stage of an example method of forming the example assembly of FIG. 3, after seeding, plating, and patterning steps.
Figure 5D:
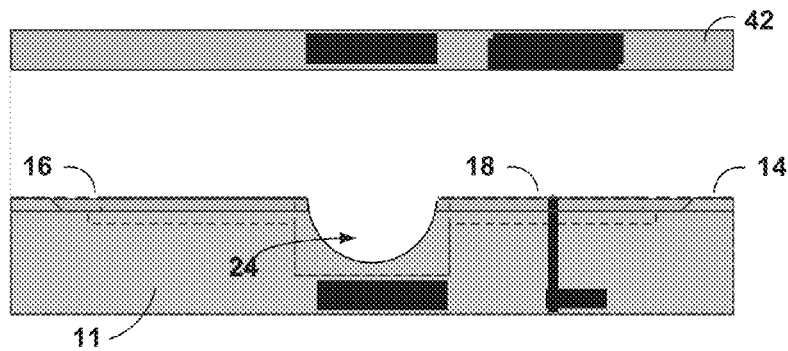
FIG. 5D is a schematic diagram illustrating a top view of a substrate at a stage of an example method of forming the example assembly of FIG. 3, after a subsequent routing or milling step.

In some examples, the plurality of insulating and conductive plane layers may further define a recess 24 in edge surface 14 of substrate 4, as shown at FIG. 5D. At least a portion of recess 24 may be formed (e.g. milled or routed) between edge plating portions, to form, separate and substantially electrically isolate (e.g., electrically isolate or nearly electrically isolate) first attach pad 16 from second attach pad 18. In some examples, first attach pad 16 and second attach pad 18 extend along substantially all of a thickness or height "H" along all of the height or nearly all of the height) of edge surface 14, measured from top surface 11 to bottom surface 12 of substrate 4 (see FIG. 2A). As with laminate substrates, first and second attach pads may be connected to the edge surface of electronic assemblies, such as ceramic LGA, BGA, CGA, DFP and QFP devices, for edge mounting of an SMT component, such as a thermal jumper.

In some examples, before, during, or after placing SMT component 22 adjacent to first and second attach pads 16, 18, at least a portion of recess 24 may at least partially be filled by a bonding material 26. Bonding material 26 can bond at least to edge surface 14 and to SNIT component 22.

SMT component 22 may be at least thermally coupled to first attach pad 16 and to second attach pad 18. In some examples, first group of common conductive plane layers 6 may be thermally and electrically conductive power plane layers connected to first attach pad 16 (see FIG. 2B), while second group of common conductive plane layers 8 may be thermally and electrically conductive ground plane layers connected to second attach pad 18 (see FIG. 2C), with electrical isolation being maintained as between the attach pads and respective groups of conductive plane layers by recess 24, bonding material 26 and/or insulating or dielectric plane layers, or the like. By further way of example, conductive plane layers 10a, 10b, and 10c (see FIG. 2C) may be thermally and electrically conductive signal plane layers electrically isolated from other types of conductive plane layers. Power, ground, signal, and/or heat dissipation conductive plane layers may optionally be disposed in any number of suitable configurations of assembly 2. In other examples, a group of at least two electrically and thermally conductive signal plane layers may be connected to and thermally coupled to a first attach pad, while electrically and thermally conductive ground plane layers may be connected to and thermally coupled to a second attach pad, with electrical isolation being maintained as between the attach pads and respective groups of conductive plane layers, by recess 24, bonding material 26 and/or insulating or dielectric plane layers, or the like. In some examples, all conductive plane layers of substrate 4 are thermally coupled to at least one of first attach pad 16, second attach pad 18, or an additional attach pad. Assembly 2 may further include a solder material 20 that connects first attach pad 16 to SMT component 22 and second attach pad 18 to SMT component 22. Solder material 20, as described herein, may be composed of any number of common soldering materials, for example, solder fillet, solder paste such as a metal solder alloy suspended in flux, or metal solder composed of, for example, a metal alloy such as tin-lead, fin-silver-copper, or tin-antimony alloys. A bonding material 26 may be dispensed in recess 24 and solder material 20 dispensed on to first and second attach pads 16 and 18. SMT component 22 (e.g., thermal jumper) may then be placed adjacent to the first and second attach pads, following by a curing of bonding material, drying of solder material 20, then reflowing (for example, vapor phase relaxing or infrared reflowing) of solder material 20 to form the electrical and thermal connections between the SMT component, and the first and second attach pads 16 and 18 and common conductive plane layers 6 and 8, respectively. The cured bonding material may prevent the SMT component from moving or shifting during solder reflow. The bonding material is typically cured and the solder paste dried during the initial ~150° C. pre-heat stage of the solder reflow process. When thermal jumpers are edge-mounted, they may be bonded on to one edge surface at a time, so that each edge surface can be orientated horizontally during the bond cure and solder material dry process.

In some examples, after SMT component 22 is bonded to bonding material 26, SMT component 22 may be further mounted to first and second attach pads 16, 18 by reflow soldering (for example, vapor phase or infrared reflow soldering), to form assembly 2. Solder material 20 may be heated at, for example, a range of about 180° C. to 235° C. during vapor phase reflow soldering.

In other examples, SMT component 22 may be mounted to additional attach pads on edge surface 14 and/or additional SMT components may be mounted to the first, second or additional attach pads of the assembly. Such additional attach pads each may be at least thermally coupled to respective groups of common conductive plane layers, while remaining substantially electrically isolated (e.g., isolated or nearly isolated) from other attach pads of the assembly. This disclosure further contemplates that a second or additional SMT components, along with SMT component 22, may be mounted on attach pads of the assembly in some examples, whereby the one or more additional SMT components may be at least thermally coupled and connected to the attach pads in the same manner as described with respect to placement and mounting of SMT component 22.

In some examples of the assembly of FIG. 1, SMT component 22 may be a thermal jumper. The thermal jumper may be an SMT chip component of various sizes composed of, without limitation, beryllium oxide or beryllia (BeO), aluminum nitride (AlN), or diamond formed by at least one of CVD/CVI, with metal terminations. Such thermal jumpers may be electrically insulating yet provide thermal conduction to, for example, Cu conductive plane layers, maintaining AC/DC electrical isolation between these conductive plane layers.

Assemblies according to this disclosure including, for example, an edge-mounted thermal jumper as shown at FIG. 1, may enhance conduction cooling thermal management of electronic assemblies, in light of industry trends, such as higher switching frequencies, signal edge rates, and device and PBA power levels and densities, as well as lower component input/output (I/O) and core supply rail voltage levels. The substrate structures, SMT thermal jumpers, assemblies and methods of this disclosure may reduce the thermal resistance between the components and mounting interface of an electronic assembly. Further, the substrate edge plate structures replace via connections that perforate and increase impedance of non-common conductor layers and consume signal routing area. Furthermore, multiple common conductor layers or layer areas can extend directly into each edge-mount attach pad, which eliminate the thermal bottleneck of top or bottom attach pads that are limited to higher impedance via and/or trace connections. The thermal management structures and methods disclosed herein may meet increasing electrical, mechanical, and thermal design challenges of the industry.

FIG. 2A is a schematic diagram illustrating a side view of the example assembly of FIG. 1 of this disclosure along line A-A. As discussed above, FIG. 2A illustrates, for example, attach pads 16, 18 extending along substantially all of the height "H" (e.g., along all of the height or nearly all of the height) of edge surface 14, measured from top surface 11 to bottom surface 12 of substrate 4. Assembly 2 as depicted at FIG. 2A also includes dielectric or insulating layers 7a, 7b, and 7c (not all dielectric/insulating layers are labeled), of the plurality of plane layers of substrate 4. FIG. 2B is a schematic diagram illustrating a cross-sectional view of the example assembly of FIG. 2A along line B-B. As shown in FIG. 2B, thermally and electrically conductive common plane layers 6a, 6b, and 6c (for example, first group of common conductive plane layers 6) connect to and extend directly into first attach pad 16. Attach pad 16 extends along the entire height H of edge surface 14, connecting common power plane layers to the edge-mounted SMT component 22, such as a thermal jumper, along an increased surface area of reduced thermal impedance, as compared to thermal jumpers not mounted in the manner disclosed herein. As further shown in FIGS. 2. 2B, and 2C, electrical isolation may be maintained as between the respective groups of common conductive plane layers at least by spaces or the insulating or dielectric plane layers 7a, 7b and 7c (see FIG. 2A) (among others) of substrate 4. FIG. 2C is a schematic diagram illustrating a cross-sectional view of the example assembly of FIG. 2A along line C-C. As shown at FIG. 2C, thermally and electrically conductive common plane layers 8a, 8b, and 8c (for example, second group of common conductive plane layers 8) connect to and extend directly into second attach pad 18, which likewise extends along the entire height H of edge surface 14. In the example of FIG. 2C, thermally and electrically conductive signal plane layers 10a, 10b, and 10c (among others) are electrically isolated from the power and ground conductive plane layers at least by dielectric or insulating plane layers or spaces of substrate 4. While dashed lines representing internally disposed first group of common conductive plane layers 6, second group of common conductive plane layers 8, and conductive signal plane layers 10a, 10b, and 10c are shown at FIG. 2A, those layers may not necessarily extend to edge surface 14 of substrate 4 in the portions of substrate 4 not covered at edge surface 14 by attach pads 16 and 18. In such an example, edge surface 14 may be defined at least partially by dielectric or insulating layers 7a, 7b, and 7c.

Edge surface-mounted attach pads as described herein may present equally low electrical and thermal impedance connections across all connected conductive plane layers of substrate 4. Further, edge surface-mounted first and second attach pads 16, 18, solder material 20, and first and second terminals 21 and 23 of SMT component 22 provide low electrical and thermal impedance connections between and to common plane layer groups 6 and 8 without the need for conventional trace and via connections. Such substrate edge plate connection structures free up space on layers of the substrate for component placement and signal routing. Wide plated edge surfaces (e.g., the attach pads described herein) also present desirable features such as low equivalent series inductance (ESL) and low equivalent series resistance (ESR). Attach pads may provide properties preferable over conventional via and trace connections, for example, attach pads connected to substantially all of a height of an edge surface may not encounter a limitation of vias, such as increased electrical and thermal impedance in conductive plane layers when reductions in electrical and thermal impedance are attempted. For instance, via aspect ratio (via length divided by via diameter) may be limited to ≤8 to insure reliable via wall plating and a minimum via wall plating thickness. Excessive via plating can cause "dog boning," where via wall plating is thicker at a substrate surface. As via diameter increases, via wall plating thickness can increase, but connected plane layer perforation also increases and the number of via connections per unit area decreases. Thus, as noted, attempts to reduce via electrical and thermal impedance may increase the connected conductive plane layer electrical and thermal impedance. Plated edge surfaces (including the attach pads of this disclosure) may not be limited by via aspect ratio. Moreover, a single wide, thick-plated edge surface with, for example, a mounted thermal jumper, can replace multiple via connections between surface pads an internal planes while providing equivalent or lower electrical and thermal impedance between same. Further, removing filled via connections from surface pads may eliminate bubbled up plating and provide a flat surface for a beneficial thermal pressure contact interface. As noted, plated edge connections can be used to form a substantially closed Faraday cage around power, ground, and signal interconnects between substrate components.

Substrate edge plating as disclosed herein also may improve electromagnetic compatibility and interference (EMC and EMI) performance by forming a closed Faraday shield around all conductive plane layers of substrate 4. Assembly configurations disclosed herein may approach the physical limit for low electrical and thermal impedance connections between common conductive plane layers and between SMT components and substrate conductive plane layers.

In some examples, an electrical or non-electrical component (as described above) may be mounted on substrate 4, such that the component is at least thermally coupled to, for example, the first group of common conductive plane layers 6 and to the second group of common conductive plane layers 8 of substrate 4. Further, in such examples, thermal energy generated or retained by the electrical or non-electrical component is conducted between the first component, first group of common conductive plane layers 6, first attach pad 16, and SMT component 22, and between the electrical or non-electrical component, second group of common conductive plane layers 8, second attach pad 18, and SMT component 22.

Figure 3:
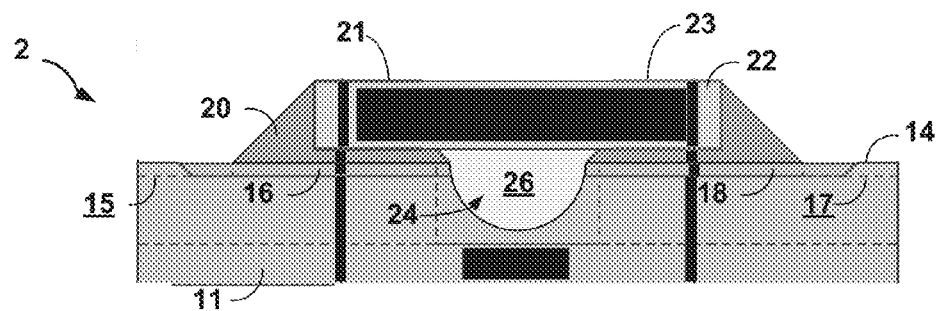
FIG. 3 is a schematic diagram illustrating a top view of the example assembly of FIG. 2A.

FIG. 3 is a schematic diagram illustrating a top view of the example assembly of FIG. 2A. As shown, assembly 2 of FIG. 3 may include, without limitation, SMT component 22 after having been bonded with bonding material 26 to the recessed edge surface of FIG. 3 and reflow soldered with solder material 20 to first and second attach pads 16, 18, respectively. In some examples, reflow soldering of SMT component 22 to attach pads 16, 18 (in the assemblies of FIG. 1 or 3, for example) may include vapor phase reflow soldering of a first terminal 21 and a second terminal 23 of SMT component 22 to first and second attach pads 16, 18, respectively. Due to the presence of a relatively large amount of copper (Cu) connected directly to the edge-mounted attach pads as described by this disclosure, hand soldering of an edge-mount SMT component may be less preferred than vapor phase or infrared reflow soldering. As further shown at FIG. 3 by a dashed line 15 representing an outline for the internally disposed first group of common conductive plane layers 6a, 6b, and 6c (for example, conductive circuit power plane layers), the conductive power plane layers extend directly in to first attach pad 16. Likewise, FIG. 3 shows a dashed line 17 representing an outline for the internally disposed second group of common conductive plane layers 8a, 8b and 8c (for example, common ground plane layers) extending directly in to second attach pad 18. Internal groups of common conductive plane layers 6a-6c and 8a-8c are substantially electrically isolated from one another by at least insulating or dielectric plane layers or spaces disposed between them (not shown in FIG. 3). In some examples, top surface 11 (for example, a conductive layer) or bottom surface 12 (for example, a conductive layer) of substrate 4 may have undergone photo-etch patterning, and portions of the edge plating on edge surface 14 may have been separated by, for example, recess 24 by milling or routing.

Figure 4:
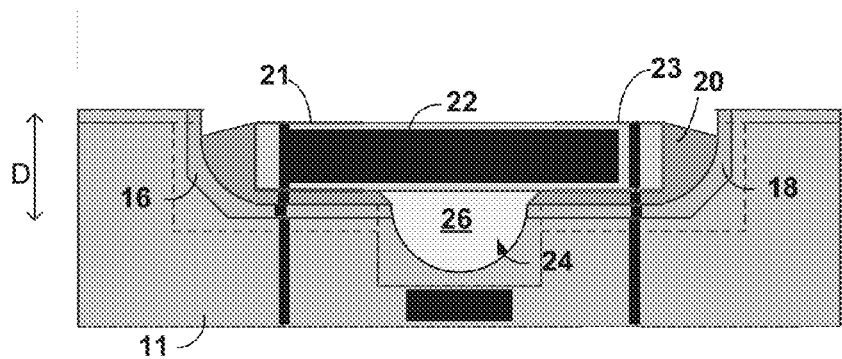
FIG. 4 is a schematic diagram illustrating a top view of another example assembly.

FIG. 4 is a schematic diagram illustrating a top view of another example assembly according to this disclosure. As noted above, in some examples, a portion of edge surface 14 of substrate 4 may be recessed from the periphery of substrate 4, whereby a recessed edge surface defined by the plurality of plane layers of the substrate (e.g., dielectric layers and conductive plane layers) may have a varying and maximum depth "D" measurable from edge surface 14 along the outer periphery of substrate 4. First attach pad 16 and second attach pad 18 can be formed on (e.g., plated on) the recessed edge surface, so that an SMT component 22, such as a thermal jumper, can be mounted on and at least thermally coupled to the first and second recessed attach pads. In the example assembly of FIG. 4, the SMT component may be disposed substantially entirely within (e.g., entirely within, or nearly entirely within) the depth D measured between peripheral edge surface 14 and the recessed edge surface. When SMT component 22 is mounted on attach pads on the recessed edge surface as described, solder material 20 may be in contact not only with the bottom surface of first and second terminals 21, 23 of SMT component 22 (e.g., a thermal jumper), but also with one or more side or edge surfaces of terminals 21, 23 of SMT component 22, providing an increased surface area of contact and lower thermal and/or electrical resistance or impedance in conducting thermal and/or electrical energy.

Bonding material 26, such as epoxy, may at least partially fill recess 24 and bond at least to edge surface 14 and to SMT component 22 when, for example, SMT component 22 is placed adjacent to first attach pad 16 and second attach pad 18. As noted, SMT component 22 may be bonded to edge surface 14 with a bonding material 26 such as epoxy, and first and second terminals 21, 23 of SMT component 22 may be reflow soldered to first attach pad 16 and second attach pad 18, respectively. Such a configuration may free up space for top and bottom surface component placement signal routing or other features, but also allows for existing processing and handling of edge surfaces of the assembly due to SMT component 22 being recessed from top surface 11, bottom surface 12 and/or edge surface 14 of substrate 4, and causing no interference to other components that may be placed on edge surface 14. Moreover, placement of SMT component 22 within a cavity recessed from the outer periphery of edge surface 24 may allow for an increased surface area of contact as between solder material 20 and SMT component 22 and attach pads 16, 18, reducing impedance and enhancing thermal conductivity along the thermal pathway from common conductive plane layer groups 6, 8, through attach pads 16, 18 to SMT component 22, such as a thermal jumper. In some examples, after all edge-mount components are first connected by reflow soldering, other components can be attached to top surface 11, bottom surface 12, or other sides of the substrate by standard assembly processes.

FIGS. 5A-5D are schematic diagrams illustrating a series of stages of laminate substrate fabrication and assembly steps of an example method of forming the example assembly of FIG. 3, as further discussed below in connection with the flow diagram of FIG. 7. FIG. 5A is a schematic diagram illustrating a top view of a laminate substrate at an initial stage of an example method of forming the example assembly of FIG. 3. FIG. 5A depicts a laminate substrate 4 before slot milling or routing of substrate 4 that is part of a larger panel 42 (for example, an integral supporting panel), from which multiple substrates and electronic assemblies may be fashioned. A dashed line 40 designates a pattern or outline for the intended periphery of edge surface 14. Dashed line 40 is coincident with a slot edge surface 44 of a slot 46 (see FIG. 5B) to be milled or routed, also shown in dashed lines. Panel 42 may be composed of substantially similar or the same materials as described in reference to substrate 4 above, including but not limited to electrically and thermally conductive plane layers such as copper layers, and dielectric or insulating plane layers. In-panel assembly can simplify substrate and electronic assembly handling, and supports standardized panel sizes on the assembly floor to reduce cost. The electronic assembly may be excised from its supporting panel border, after assembly and testing in some cases, by routing away the connecting tabs between the electronic assembly area and the supporting peripheral border. Dashed line 15 shows the pattern for the internally disposed first group of common conductive plane layers 6a, 6b, 6c or layer areas, which extend beyond dashed line 40 representing the intended substrate periphery of edge surface 14 prior to milling or routing, as shown by the example substrate 4 of FIG. 5A which is coextensively connected to panel 42 at this stage. Dashed line 17 also shows a pattern for the internally disposed second group of common conductive plane layers 8a, 8b, and 8c or layer areas, which also extend beyond dashed line 40 representing intended edge surface 14 prior to milling or routing. For simplicity of presentation, all conductive plane layers are not shown at FIG. 5A. In some examples, at the processing stage of FIG. 5A, top and bottom surface conductive plane layers of panel 42 may not yet include patterning and may be solid copper.

FIG. 5B is a schematic diagram illustrating a top view of a substrate at a stage of an example method of forming the example assembly of FIG. 3, after a routing or milling step. In particular, FIG. 5B depicts the substrate of FIG. 5A after slot 46 is milled or routed in substrate 4. At this stage of processing, portions of the first group of common conductive plane layers 6a, 6b, and 6c (as shown in FIG. 2B) and portions of the second group of common conductive plane layers 8a, 8b, and 8c (as shown in FIG. 2C) may be exposed at a slot edge surface 44 of slot 46.

FIG. 5C is a schematic diagram illustrating a top view of a substrate at a stage of an example method of forming the example assembly of FIG. 3, after dielectric etching (optional), palladium (Pd) seeding, copper (Cu) plating, and patterning steps. Dielectric etching may enhance mechanical adhesion of Cu to dielectric layers. Palladium seeding can enable Cu plating on to dielectric layers. In particular, FIG. 5C depicts slot edge surface 44 of substrate 4 after dielectric etching (optional), Pd seeding, and Cu plating to form plated slot edge surface 48. FIG. 5C also shows substrate 4 after top and bottom (not shown) surface conductor layer photo-etch patterning. At this point in the technique, the first and second group of common conductive layer areas and the conductive top surface layer of panel 42 are connected together. Laminate substrates with plated surface conductive plane layers as disclosed herein may provide desirably low electrical and/or thermal impedance connections between common conductive plane layers or layer areas and nearby SMT components, without the need for multiple conventional via connections that perforate non-common conductive plane layers and consume signal routing area. Laminate substrate edge plating can be implemented at sub-lamination or final lamination phases of the laminate substrate fabrication process. As many edge plate connection structures as needed can be fabricated along each sub-lamination and final lamination substrate edge.

FIG. 5D is a schematic diagram illustrating a top view of a substrate at a stage of an example method of forming the example assembly of FIG. 3, after one more subsequent routing or milling steps. In particular, FIG. 5D depicts the plated slot of FIG. 5C after electrically isolated first and second attach pads 16, 18 have been separated from panel 42 and from each other by recess 24. Recess 24 and the space between panel 42 and edge surface 14 have been created by milling or routing edge and surface plating to form electrically isolated first attach pad 16 and second attach pad 18, which previously had been a part of or connected to plated slot edge surface 48 as shown in FIG. 5C. The assembly of FIG. 4 may be formed by a technique similar to that described in reference to FIGS. 5A-5D, with a recess being formed (for example, by milling or routing) in edge surface 14 that allows SMT component 22 to be disposed within such a recess, beneath the outer periphery of edge surface 14.

Figure 6:
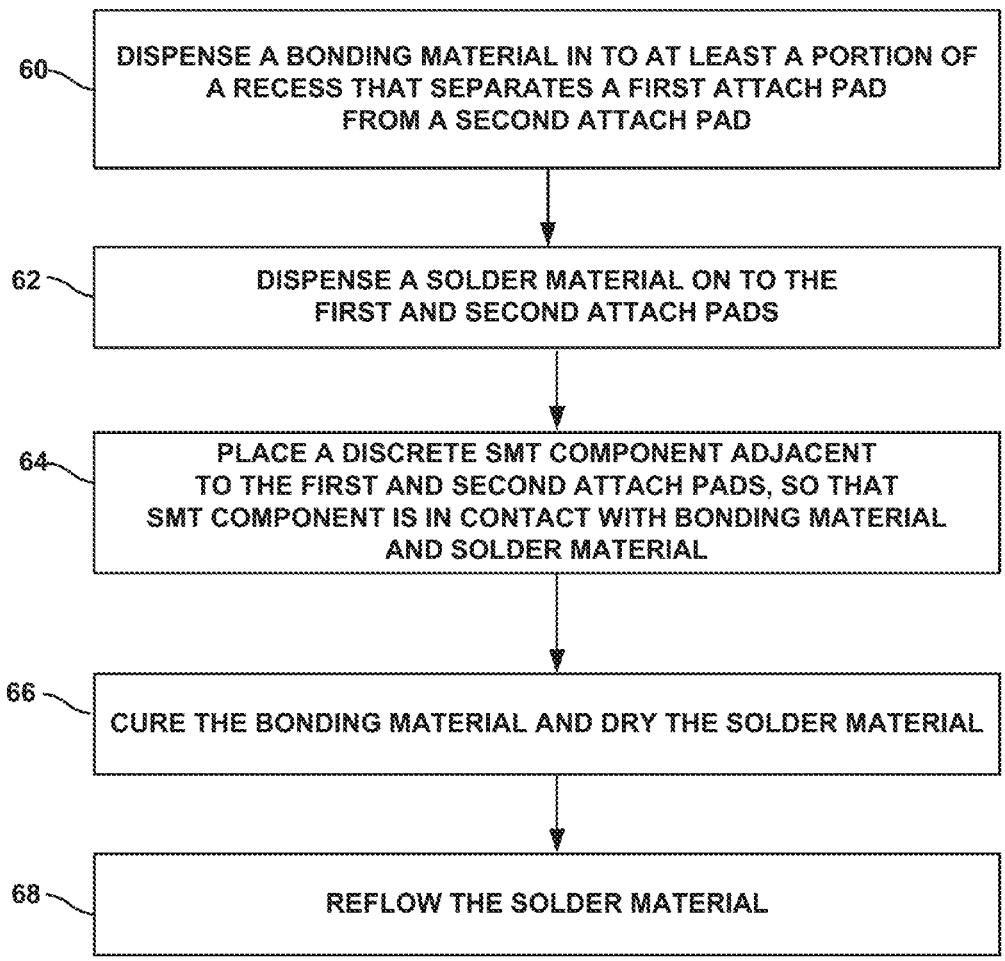
FIG. 6 is a flow diagram illustrating an example method of forming an assembly according to this disclosure.

FIG. 6 is a flow diagram illustrating an example method of forming an assembly according to this disclosure. In addition to typical prepatory processing steps, an example assembly may be formed by dispensing bonding material 26 in to at least a portion of recess 24 (60) and dispensing a solder material 20 on to first and second attach pads 16, 18 (62) by suitable methods. Bonding material 26 may bond to at least the recessed portion of edge surface 14 of substrate 4. As described above, solder material 20 may be composed of any number of common soldering materials, for example, solder paste such as a metal solder suspended in flux, or metal solder composed of, for example, a metal alloy such as tin-lead, tin-silver-copper, or tin-antimony alloys. Discrete SMT component 22 then may be placed adjacent to the first and second attach pads 16, 18, so that SMT component 22 is in contact with bonding material 26 and solder material 20 (64). For example, first terminal 21 of SMT component 22 may be placed in contact with solder material 20 dispensed on first attach pad 16, and second terminal 23 of SMT component 22 may be placed in contact with solder material 20 dispensed on second attach pad 18. Other suitable methods of placing SMT component 22 adjacent to first and second attach pads 16, 18 also may be utilized. Placement may be performed by any number of known methods, for example, manually or robotically. The method of FIG. 6 also includes mounting SMT component 22 to first and second attach pads 16, 18 by curing bonding material 24 and drying solder material 20 (66). Such curing may take place at, for example, about 150° C. Curing at this temperature may, at the same time, dry solder material 20. In some examples, in performing steps 60 through 66 of the technique of FIG. 6, substrate 4 may be oriented such that the edge surface including the attach pads on which the steps are performed is facing upward. Substrate 4 may then be oriented such that one or more other edge surfaces and respective attach pads are facing upward for the carrying out of steps 60 through 66 performed on those edge surfaces facing upward. This procedure may continue until steps 60 through 66 have been performed on all edge attach pads. In such an example, step 68, as described further, may be performed simultaneously with respect to solder material connecting all SMT components bonded to the substrate at one or more edge surfaces. The example method further includes reflowing of solder material 20 (68), for example vapor phase or infrared reflowing, at a temperature range of about 180° C. to about 235° C. The method optionally also may include cleaning the assembly to remove, for example, any solder flux. Mounting of SMT component 22 to first and second attach pads 16, 18 may be performed by other suitable methods as well.

The assembly described in the technique of FIG. 6 may the assemblies described above in FIGS. 1-4. For example, assembly 2 may include substrate 4 including a plurality of conductive plane layers, wherein the plurality of conductive plane layers includes a first group of common conductive plane layers 6a, 6b, and 6c, and a second group of common conductive player layers 8a, 8b, and 8c, wherein the plurality of conductive plane layers (among other layers) defines edge surface 14 of the substrate disposed between top surface 11 and bottom surface 12 of substrate 4, a component mounted on substrate 4 (for example, an electrical component or non-electrical component), where the component is thermally coupled to one or more layers of the plurality of conductive plane layers. The assembly further includes first attach pad 16 on edge surface 14 of substrate 4, where first attach pad 16 is thermally coupled to the first group of common conductive plane layers, and second attach pad 18 on edge surface 14 of substrate 4, where second attach pad 18 is thermally coupled to the second group of common conductive plane layers. In the assembly as described according to the method of FIG. 6, first attach pad 16 is substantially electrically isolated from second attach pad 18, and the first group of common conductive plane layers is substantially electrically isolated from the second group of common conductive plane layers. Further, discrete SMT component 22 is mounted on first attach pad 16 and second attach pad 18 such that the SMT component 22 is thermally coupled to the first group of common conductive plane layers via first attach pad 16 and to the second group of common conductive plane layers via second attach pad 18, after having undergone at least the preceding steps described with respect to the technique of FIG. 6.

Figure 7:
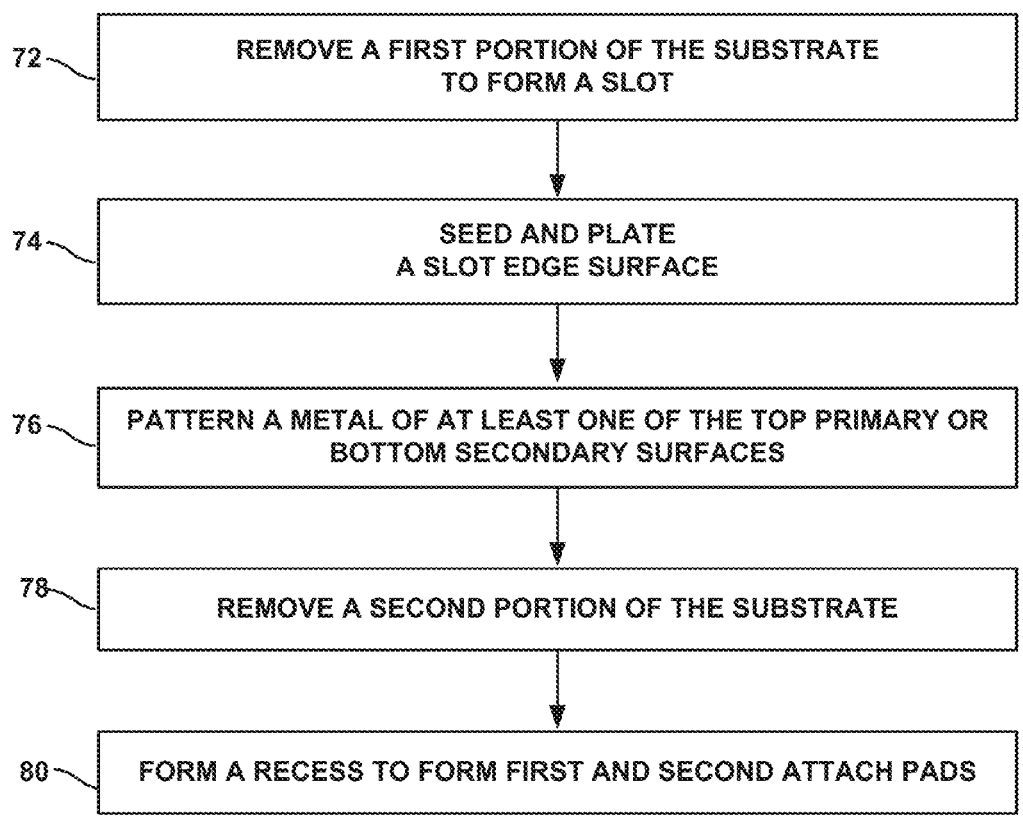
FIG. 7 is a flow diagram illustrating additional steps of an example method of forming an assembly according to this disclosure.

FIG. 7 is a flow diagram illustrating additional steps of an example method of forming an assembly according to this disclosure. For example, the steps of FIG. 7 illustrate an example technique of forming a laminate substrate structure according to this disclosure. In some examples, in forming substrate 4 of assembly 2 as described herein, prior to dispensing bonding material 26 and solder material 20 as discussed with respect to the technique of FIG. 6, a first portion of substrate 4 may be removed to form slot 46 in substrate 4, where substrate 4 is coextensively connected to panel 42, and where at least each plane layer of the first and second groups of common conductive plane layers at least partly extends in to the first portion of substrate 4 that is removed (72), as shown, for example, at FIG. 5A. The first portion of substrate 4 to be removed is disposed in what will become slot 46. Slot 46 may extend through at least a portion of at least the plurality of conductive plane layers of substrate 4 (for example, slot 26 may extend through some or all of the plurality of conductive plane layers and/or other dielectric plane layers). Removal of the first portion of substrate 4 may be done, for example, by milling or routing.

A slot edge surface 44 is formed upon removal of the first portion of the substrate, whereby slot edge surface 44 defined the periphery of slot 46 in the substrate coextensively connected to panel 42, as shown, for example, at FIG. 5B. The described example technique also includes seeding and plating of at least slot edge surface 44 of the substrate exposed by formation of slot 46 (74), to form plated slot edge surface 48 (see FIG. 5C). Prior to seeding and plating, slot edge surface 44 also may optionally be etched by, for example, dielectric etching. Slot edge surface 44 may be plated, for example, with a layer of electrically and thermally conductive material such as copper, nickel, tin, aluminum, or the like. In some examples, slot edge surface 44 may be plated with a layer of electrically and thermally conductive material between approximately 0.5 mils (0.0005") and approximately 2 mils (0.002") thick, although other thicknesses are possible. Further, in some examples, at least one of top surface 11 or bottom surface 12 of the substrate includes a metal (for example, Cu), the example technique includes patterning, by suitable techniques, of the metal of the at least one of top surface 11 or bottom surface 12, so that the metal surrounds the plated slot edge surface 48 defining slot 46 (76), as shown, for example, at FIG. 5C. After formation of plated slot edge surface 48, plated slot edge surface 48 and the portion of metal top surface 11 or bottom surface 12 surrounding plated slot edge surface 48 may form a continuous, or wrap-around, layer of metal, such as copper.

The example technique of FIG. 7 also includes removal of a second portion of substrate 4 (e.g., by suitable milling or routing methods) to isolate a portion of plated slot edge surface 48 (78), and the forming of recess 24 in the isolated portion of plated slot edge surface 48 to form first and second attach pads 16, 18 on edge surface 14 (80), as shown, for example, at FIG. 5D.

In this example technique, the portion of isolated plated slot edge surface 48 adjacent to one side of recess 24 is first attach pad 16, and the portion of plated slot edge surface 48 adjacent to a side of recess 24 opposite of the first side referenced is second attach pad 18. Recess 24 separates and substantially electrically isolates (for example, nearly electrically isolates or entirely electrically isolates) first attach pad 16 from second attach pad 18. Additional copper plating of drilled, milled or routed structures may be applied as needed, to achieve desired electrical and/or thermal impedance or resistance levels. Selective nickel and/or electroless nickel or electroless platinum immersion gold (ENEPIG) plating may also be applied to all exposed copper (Cu).

The disclosed techniques for fabricating a sub-lamination or final lamination substrate with one or more plated edge surfaces may include patterning (e.g., photo etching) and laminating substrate layers according to conventional PB processes, although common surface and buried plane portions to be connected to a plated edge may be extended beyond the finished milled/routed edge(s) to ensure exposure and connection to the edge plating. As described above, conductive plane layers that extend a minimum distance beyond the intended periphery of a slot may be provided to enhance metallurgical anchoring of plating to the slot edge surface. Portions of those conductive plane layers also may be isolated by dielectric etching to at least partially define slot pads 9. Exposed dielectric layers of the plurality of plane layers exposed at slot edges also may be etched to enhance mechanical anchoring of edge plating. Such edge plate pads need not necessarily be photo-etch patterned on the panel border side that will be excised (e.g., milled/routed off). According to this technique, all substrate edges or edge segments to be plated can be milled or routed. Optionally, through-hole vias may be drilled and plated at the same time slots in the substrate are milled or routed and plated. Dielectric layers may be etched, as necessary, in all through-hole vias and milled/routed edges to be plated to enhance mechanical bonding of edge plating. The assembly through holes and milled/routed slats may be seeded (e.g., with palladium) and may be copper plated, for example. Patterning (e.g., photo etching) of surface metal layers may optionally be applied, as described above.

Further, as discussed recess 24 may be formed in the isolated portion of plated slot edge surface 48 to form and electrically separate first attach pad 16 and second attach pad 18. For example, a portion of plated slot edge surface 48 adjacent to one side of recess 24 is first attach pad 16, a portion of the plated edge surface adjacent to the other side of recess 24 opposite of the one side is second attach pad 18, and recess 24 separates and substantially electrically isolates first and second attach pads. As noted, recess 24 and the spaces that isolate the second portion of the substrate, referenced above, may be formed using any suitable technique, such milling or routing. Other portions of substrate 4, or of a larger panel 42 of which substrate 4 is a part, may optionally be routed or milled before or after milling of recess 42, to form the desired geometry of a PBA, package or other device in a substantially final configuration for operation.

Further, a second SMT component may, in some examples, be placed adjacent to and mounted to the first and second attach pads in the same manner as a first SMT component. Likewise, additional attach pads may be connected to (e.g., plated on) one or more edge surfaces of the substrate (for example, on the periphery of the substrate, or internally disposed within the substrate) of an example assembly of this disclosure. Alternatively, the edge attach pads can wrap around onto the substrate top (primary) and/or bottom (secondary) surfaces for mounting additional SMT components in parallel. Moreover, as also described above, the techniques disclosed herein may also include substrate configurations where at least one common conductive plane layer of a first group of common conductive plane layers includes a first area of at least one conductive plane layer, and at least one common conductive plane layer of the second group of common conductive plane layers includes a second area of the same at least one conductive plane layer referenced.

Various examples of the disclosure have been described. These and other examples are within the scope of the following claims.

What is claimed is:

1. A method for forming an assembly, the method comprising:
    placing a discrete surface mount technology (SMT) component adjacent to a first attach pad and to a second attach pad; and
    mounting the discrete SMT component to the first and second attach pads to form the assembly, wherein the assembly comprises:
        a substrate comprising a plurality of conductive plane layers, wherein the plurality of conductive plane layers comprises a first group of common conductive plane layers and a second group of common conductive player layers, and wherein the plurality of conductive plane layers at least partially defines an edge surface of the substrate disposed between a top surface and a bottom surface of the substrate;
        the first attach pad on the edge surface of the substrate, wherein the first attach pad is thermally coupled to the first group of common conductive plane layers; and
        the second attach pad on the edge surface of the substrate, wherein the second attach pad is thermally coupled to the second group of common conductive plane layers, the first attach pad is substantially electrically isolated from the second attach pad, and the first group of common conductive plane layers is substantially electrically isolated from the second group of common conductive plane layers, wherein the discrete SMT component is mounted on the first attach pad and the second attach pad such that the SMT component is thermally coupled to the first group of common conductive plane layers via the first attach pad and to the second group of common conductive plane layers via the second attach pad.

2. The method of claim 1, wherein the discrete SMT component comprises a thermal jumper.

3. The method of claim 1, wherein an electrical component mounted on the substrate is at least thermally coupled to the first and second groups of common conductive plane layers, such that thermal energy generated by the electrical component is conducted between the component, the first group of common conductive plane layers, the first attach pad, and the SMT component, and between the electrical component, the second group of common conductive plane layers, the second attach pad, and the SMT component.

4. The method of claim 1, wherein at least one common conductive plane layer of the first group of common conductive plane layers comprises a first area of at least one conductive plane layer of the plurality of conductive plane layers, and at least one common conductive plane layer of the second group of common conductive plane layers comprises a second area of the at least one conductive plane layer.

5. The method of claim 1, further comprising:
    prior to placing the discrete SMT component adjacent to the first and second attach pads, dispensing a bonding material in to at least a portion of a recess that separates the first attach pad from the second attach pad, wherein the bonding material bonds to at least the edge surface of the substrate;
    dispensing a solder material on to the first and second attach pads,
    wherein, after dispensing the bonding and solder materials, placing the discrete SMT component adjacent to the first and second attach pads comprises placing the discrete SMT component in contact with the bonding material and the solder material, wherein a first terminal of the discrete SMT component is placed in contact with the solder material dispensed on to the first attach pad and a second terminal of the discrete SMT component is placed in contact with the solder material dispensed on to the second attach pad, and
    wherein, after placing the discrete SMT component, mounting the discrete SMT component to the first and second attach pads to form the assembly comprises:
    curing the bonding material;
    drying the solder material; and
    reflow soldering the solder material.

23

6. The method of claim 5, further comprising, prior to dispensing bonding material and solder material:
   removing a first portion of the substrate to form a slot in the substrate, wherein the substrate is coextensively connected to a panel and at least each plane layer of the first and second groups of common conductive plane layers at least partly extends in to the first portion of the substrate that is removed, and wherein the slot extends through at least a portion of at least the plurality of conductive plane layers of the substrate;
   seeding and plating at least a slot edge surface of the substrate exposed by formation of the slot to form a plated slot edge surface,
   wherein at least one of the top surface or the bottom surface of the substrate comprises a metal, patterning the metal of the at least one of the top surface or bottom surface so that the metal surrounds the plated slot edge surface defining the slot;
   removing a second portion of the substrate to isolate a portion of the plated slot edge surface; and
   forming the recess in the isolated portion of the plated slot edge surface to form the first and second attach pads on the edge surface, wherein a portion of the isolated plated edge surface adjacent to one side of the recess comprises the first attach pad, a portion of the plated edge surface adjacent to a side of the recess opposite of the one side comprises the second attach pad, and the recess separates and substantially electrically isolates the first attach pad from the second attach pad.

7. An assembly comprising:
   a substrate comprising a plurality of conductive plane layers, wherein the plurality of conductive plane layers comprises a first group of common conductive plane layers and a second group of common conductive plane layers, and wherein the plurality of conductive plane layers at least partially defines an edge surface of the substrate disposed between a top surface and a bottom surface of the substrate;
   a first attach pad on the edge surface of the substrate, wherein the first attach pad is at least thermally coupled to the first group of common conductive plane layers;
   a second attach pad on the edge surface of the substrate, wherein the second attach pad is at least thermally coupled to the second group of common conductive plane layers, wherein the first attach pad is substantially electrically isolated from the second attach pad, and the first group of common conductive plane layers is substantially electrically isolated from the second group of common conductive plane layers; and
   a discrete surface mount technology (SMT) component mounted on the first attach pad and the second attach pad such that the discrete SMT component is at least thermally coupled to the first group of common conductive plane layers via the first attach pad and to the second group of common conductive plane layers via the second attach pad.

8. The assembly of claim 7, wherein the discrete SMT component comprises a thermal jumper.

9. The assembly of claim 7, wherein the substrate comprises:
   a printed board (PB), or
   the substrate of an integrated circuit (IC), multichip module (MCM), hybrid package, or electronic package, wherein the substrate of the IC, MCM, hybrid package, or electronic package is either separate from or integral to the IC, MCM, hybrid package, or electronic package.

24

10. The assembly of claim 7, wherein the first group of common conductive plane layers comprises either a plurality of common conductive circuit power plane layers or
   a plurality of common ground plane layers, and the second group of common conductive plane layers comprises either the plurality of common conductive circuit power plane layers or the plurality of common ground plane layers, wherein the first and second groups are not the same.

11. The assembly of claim 7, wherein each common conductive plane layer of the first group of common conductive plane layers is thermally conductive and thermally coupled to the first attach pad, and each common conductive plane layer of the second group of common conductive plane layers is thermally conductive and thermally coupled to the second attach pad.

12. The assembly of claim 7, wherein a portion of the edge surface of the substrate comprises a recess defined at least by the plurality of conductive plane layers, wherein the first and second attach pads are on the recessed edge surface, the SMT component is mounted on and thermally coupled to the first and second attach pads, and the SMT component is disposed substantially entirely within the recess.

13. The assembly of claim 7, wherein at least one common conductive plane layer of the first group of common conductive plane layers comprises a first area of at least one conductive plane layer of the plurality of conductive plane layers, and at least one common conductive plane layer of the second group of common conductive plane layers comprises a second area of the at least one conductive plane layer.

14. The assembly of claim 7, further comprising a solder material, wherein the first attach pad is attached to a first terminal of the SMT component via the solder material and the second attach pad is attached to a second terminal of the SMT component via the solder material.

15. The assembly of claim 7, wherein the edge surface at least one of:
   spans fewer than all of the plurality of conductive plane layers, or
   at least partially defines a cavity internally within the substrate and not on a periphery of the substrate.

16. The assembly of claim 7, wherein the substrate comprises a printed board, the first group of common conductive plane layers comprises at least two electrically and thermally conductive power plane layers, the second group of common conductive plane layers comprises at least two electrically and thermally conductive ground plane layers, and the SMT component comprises a thermal jumper.

17. The assembly of claim 7, wherein at leas one of the first attach pad or the second attach pad extends along substantially all of a height of the edge surface, wherein the edge surface extends from the top surface to the bottom surface of the substrate.

18. The assembly of claim 7, further comprising an electrical component mounted on the substrate, wherein the electrical component is at least thermally coupled to the first and second groups of common conductive plane layers, such that thermal energy generated by the electrical component is conducted between the electrical component the first group of common conductive plane layers, the first attach pad, and the SMT component, and between the electrical component, the second group of common conductive plane layers, the second attach pad, and the SMT component.

19. The assembly of claim 7, wherein at least the plurality of conductive plane layers defines a recess in the edge surface of the substrate, and wherein at least a portion of the recess separates and substantially electrically isolates the first attach pad from the second attach pad.

20. The assembly of claim 19, further comprising a bonding material that at least partially fills at least a portion of the recess that separates the first attach pad from the second attach pad and bonds to the edge surface of the substrate and to the SMT component.

* * * * *